United States Patent
Zavadsky et al.

(10) Patent No.: US 7,580,557 B2
(45) Date of Patent: Aug. 25, 2009

(54) METHOD OF DESIGN ANALYSIS OF EXISTING INTEGRATED CIRCUITS

(75) Inventors: Vyacheslav L. Zavadsky, Ottawa (CA); Val Gont, Kanata (CA); Edward Keyes, Ottawa (CA); Jason Abt, Kanata (CA); Stephen Begg, Ottawa (CA)

(73) Assignee: Semiconductor Insights Inc. (CA)

( * ) Notice: Subject to any disclaimer, the term of this patent is extended or adjusted under 35 U.S.C. 154(b) by 0 days.

(21) Appl. No.: 12/200,968

(22) Filed: Aug. 29, 2008

(65) Prior Publication Data

US 2008/0317327 A1   Dec. 25, 2008

Related U.S. Application Data (62) Division of application No. 10/929,798, filed on Aug. 31, 2004.

(51) Int. Cl.
 *G06K 9/00* (2006.01)
(52) U.S. Cl. .................. 382/141; 382/144; 382/145; 382/147; 382/148
(58) Field of Classification Search ................ 382/141, 382/144, 145, 147, 148
 See application file for complete search history.

(56) References Cited

U.S. PATENT DOCUMENTS

| | | | |
|---|---|---|---|
| 5,086,477 A | 2/1992 | Yu et al. | |
| 5,191,213 A | 3/1993 | Ahmed et al. | |
| 5,943,437 A | 8/1999 | Sumie et al. | |
| 6,711,293 B1 * | 3/2004 | Lowe | 382/219 |
| 2002/0057838 A1 | 5/2002 | Steger | |
| 2003/0084409 A1 | 5/2003 | Abt et al. | |
| 2003/0152276 A1 | 8/2003 | Kondo et al. | |
| 2004/0042661 A1 | 3/2004 | Ulrich et al. | |

OTHER PUBLICATIONS

Popescu, "A Study of R-tree Based Spatial Access Methods," Master's Thesis, University of Helsinki, Department of Computer Science, Helsinki, Mar. 24, 2003, pp. 1-66.

Tanimoto, "Template Matching In Pyramids," Department of Computer Science, University of Washington, Seattle, Washington 98195, Computer Graphics and Image Processing 16, 1981, pp. 356-369.

(Continued)

*Primary Examiner*—Matthew C Bella
*Assistant Examiner*—Mike Rahmjoo
(74) *Attorney, Agent, or Firm*—Price, Heneveld, Cooper Dewitt & Litton, LLP (57) ABSTRACT

The present invention involves a computationally efficient method of determining the locations of standard cells in an image of an IC layout. The initial step extracts and characterizes points of interest of the image. A coarse localization of possible standard cell locations is performed and is based on a comparison of the points of interest of an instance of an extracted standard cell and the remaining points of interest in the image. A more rigid comparison is made on the list of possible locations comprising a coarse match and a fine match. The coarse match results in a shortlist of possible locations. The fine match performs comparisons between the template and the shortlist. Further filtering is done to remove the effects of noise and texture variations and statistics on the results are generated to achieve the locations of the standard cells on the IC layout.

2 Claims, 11 Drawing Sheets

OTHER PUBLICATIONS

Ulrich et al., "Real-Time Object Recognition Using A Modified Generalized Hough Transform," © 2003 Pattern Recognition Society, Published by Elsevier Ltd., pp. 2557-2570.

Van Wamelen et al., "A Fast Algorithm For The Point Pattern Matching Problem," Dec. 10, 1999, pp. 1-12.

Wolfson et al., "Geometric Hashing: An Overview," IEEE Computational Science & Engineering, Oct.-Dec. 1997, pp. 10-21.

Smith, Stephen M. et al., "Susan—A New Approach to Low Level Image Processing," *International Journal of Computer Vision*, 23(1), 45-78 (1997).

Trajković, Miroslav et al., "Fast Corner Detection," *Image and Vision Computing*, 16 (1998) 75-87.

Prieto, Miguel Segui et al., "A Similarity Metric for Edge Images," *IEEE Transactions on Pattern Analysis and Machine Intelligence*, vol. 25, No. 10, Oct. 2003.

Fischler, Martin A. et al., "Random Sample Consensus: A Paradigm for Model Fitting with Applications to Image Analysis and Automated Cartography," *Communications of the ACM*, Jun. 1981, vol. 24, No. 6.

Shi, Jianbo et al., "Good Features to Track," *IEEE*, 1994, 1063-6919/94.

Lindeberg, Tony, "Detecting Salient Blob-like Image Structures and their Scales with a Scale-Space Primal Sketch: A Method for Focus-of-Attention," *International Journal of Computer Vision*, 11:3, 283-318 (1993).

Baeza-Yates, Ricardo et al., "An Image Similarity Measure Based on Graph Matching," *IEEE*, 0-7695-0746-8, 2000.

Goldberger, Jacob et al., "An Efficient Image Similarity Measure Based on Approximations of KL-Divergence Between Two Gaussian Mixtures," *IEEE*, 0-7695-1950-4, 2003.

* cited by examiner

METHOD OF DESIGN ANALYSIS OF EXISTING INTEGRATED CIRCUITS

CROSS-REFERENCE TO RELATED APPLICATIONS

This application is a divisional of U.S. patent application Ser. No. 10/929,798 filed Aug. 31, 2004, by Vyacheslav L. Zavadsky, et al. entitled "METHOD OF DESIGN ANALYSIS OF EXISTING INTEGRATED CIRCUITS," the entire disclosure of which is incorporated herein by reference.

BACKGROUND OF THE INVENTION

1. Field of the Invention

This invention relates to a method of design analysis of existing integrated circuits, and more particularly to the determination of the location of standard cells in an image of an IC layout.

2. Background Art

In the intensely competitive field of microelectronics, detailed analysis of a semiconductor integrated circuit product can provide valuable information as to how a particular technical problem was dealt with, overall strengths and weaknesses of a design approach, and the like. This information can be used to make decisions regarding market positioning, future designs and new product development. The information resulting from analysis of the product is typically provided through circuit extraction (reverse engineering), functional analysis and other technical means. At the core of this activity is the process of design analysis, which, in this context, refers to the techniques, and methodology of deriving complete or partial schematics, starting with essentially any type of integrated circuit in any process technology. For such technical information to be of strategic value it must be accurate and cost-effective, and it is very important that the information should be timely.

A design analysis process typically involved skilled engineers manually extracting circuit information from a set of large "photomosaics" of an integrated circuit (IC). Photomosaics are high magnification photographs of portions of an IC mosaicked or stitched together. To properly extract the circuitry, photomosaics of each polysilicon (poly) and metal layer are required. Due to advances in image processing and electron microscopy, photomosaics have been replaced with computer workstations. Topographical images of the die can be viewed on a computer through dedicated software. Each metal layer is shown as a different colour to differentiate between each other. The layers can be selected and de-selected so the engineer can view selected layers instead of all of them. Although this technique is less time-consuming than the use of photomosaics, the engineer must still manually extract all the circuitry. What is especially time-consuming is the extraction of standard cells. Standard cells can make up a large part of an IC, yet the engineer must manually extract each standard cell individually.

In order to create an efficient automated system for extracting standard cells, there are several issues that need to be addressed:

A. The poly layer of each standard cell instance is usually identical, but some of the lower metal layers can be changed from one instance to another.

B. The gray-scale image of every poly and metal layer is at least several gigabytes in size.

C. The layers are not usually perfectly aligned with one another. It is possible that the layers can be misaligned by a few pixels.

D. The poly layers typically have low contrast, high noise and contain visible distortions and brightness/contrast variations.

E. The layers typically contain many thin lines (about 3-4 pixels), so the automated standard cell extraction system must be sensitive enough to account for these lines.

F. The images can contain other cells that are very similar. The difference may be only in a couple of low contrast lines.

In order to overcome the above-described manual process, automated systems have been designed. Such systems are described in U.S. Pat. No. 5,086,477, which issued to Yu et al on Feb. 4, 1992 and U.S. Pat. No. 5,191,213, which issued the Ahmed et on Mar. 2, 1993.

In the system described in U.S. Pat. No. 5,086,477—Yu et al, the integrated circuit chip is scanned by a microscope or scanning electron microscope (SEM). The system identifies every unique cell and/or gate used in the integrated circuit. A unique abstract representation is created for each of these unique cells or gates, which are stored in a library.

In this patented system, once all unique cells have been captured in a reference library, the system attempts to associate and match all abstract features contained in the layout database to the cells in the reference library using classical template matching. However because of the magnitude of data contained in a layout database for a typical modern integrated circuit, even after the data has been compressed, the processing time required to reliably extract a netlist is excessive, and Yu et al therefore teaches that the tasks should be (manually) operator directed. The difficulty and time required for the operator directed process increases with a larger number of cells or gates, since the number of template matching operations augments exponentially with the number of reference cells and/or gates.

Once all reference cells in the Yu et al system have been template matched to the database, theoretically all features in the layout database will have been grouped and classified and a netlist can be constructed. If there are features of the layout data base that have not been classified, either the system must construct a new cell or gate to be added to the reference library and an operator is informed, or the operator is informed by the system and the operator performs this task. The cell to cell interconnects information extraction, which is required to construct a netlist, is said to be performed using template matching, which is very inefficient.

Due to the template matching approach that is required, the Yu et al system must be limited to gate-array or very structured standard cell integrated circuit analysis in which the large majority of the cells are identical, and therefore as the size of the integrated circuits increase, its efficiency decreases. It is therefore inefficient for analysis of modern ASICs or custom integrated circuits, large and/or complex integrated circuits. The Yu et al system would also be limited to applications where many devices from a few ASIC manufacturers are investigated, due to the investment and time required to develop separate reference libraries, e.g. related to a different set of design rules.

U.S. Pat. No. 5,191,213—Ahmed et al relates to a technique for removing layers of an integrated circuit and for scanning each of the layers, and does not appear to be an automated system.

The paper: L. R. Avery, J. S. Crabbe, S. Al Sofi, H. Ahmed, J. R. A. Cleaver and D. J. Weaver "Reverse engineering complex application-specific integrated circuits (ASICs)" DMSMS Conference 2002, discloses an automated macro (standard cell) extraction method where via and contact information are used to find probable locations of macros. In some cases, contact information is not readily available due to imaging and/or sample preparation issues. In other cases, such as gate arrays, contact patterns are very repetitive and cannot be used for finding even a preliminary location.

An example of an object localization method that uses point of interest matching and descriptors to characterize the vicinity of the point of interest is disclosed in U.S. Pat. No. 6,711,293, which issued to Lowe on Mar. 23, 2004. This method uses some statistics of histograms in vicinities of points of interest. The points of interest used in this method are pixel amplitude extremes.

All of the above references are herein incorporated by reference.

Therefore there is a need for a computationally affordable template matching method for finding standard cells in reverse engineered multi-layer images of an IC layout.

SUMMARY OF THE INVENTION

The present invention is directed to a method and apparatus for determining high probability locations of standard cells in an image of an IC layout in a computationally efficient manner. The first step is to extract and characterize the features of the IC layout. The next step is to further extract a standard cell from the layout that will be used as a template or basis for comparison. To obtain a coarse localization of possible locations, the features of the template are compared with the features of the remainder of the IC layout. The last step is to apply a fine filter on the shortlist of possible match locations to finally obtain high probability locations. An intermediate step may include putting the coarse localization through a coarse filter so that a further set of coarse filtered possible locations is achieved.

In accordance with another aspect of the present invention possible locations of standard cells in an image of an IC layout are determined by first extracting points of interest from the image. To characterize each of these points of interest, bitmap descriptors are created in the vicinity of each point of interest. After these initialization steps, it is necessary to extract a first instance of a standard cell from the IC layout. The bitmap descriptors from the template are compared with the remaining bitmap descriptors of the IC layout. This comparison yields a set of similar points of interest. Votes are cast on these similar points of interest to determine the confidence level on the similarity of the so-called similar points of interest. In computing the weights of the votes, the locations on the image having a high vote count, correspond to the possible locations of standard cells.

In accordance with a specific aspect of this invention, the image includes a first conductive layer of the IC and the points of interest are selected from centers of contacts on the first conductive layer, centers of vias on the first conductive layer and corners of polygons representing the first conductive layer. The bitmap descriptor comprises a grid having a number of non-overlapped rectangles, said non-overlapped rectangles represented by a first bit if they contain at least a predetermined percentage of the first conductive layer and represented by a second bit if they contain less than the predetermined percentage. Further the bitmap descriptor may be a 32-bit descriptor and the bitmap descriptors from the first instance of a standard cell comprise eight possible orientations of the standard cell.

In accordance with a further aspect of the present invention a possible location of a standard cell in an image of an IC layout is determined to be a high probability match of the standard cell using a rigid comparison method. The first step is to compute the pixel gradients of the template and each possible location. Next, the dot products between the gradients of the template and each possible location are computed. Applying morphological dilation filters the dot products to remove any effect from noise or texture variations. Order statistics are computed on the filtered dot products and if the resulting statistics are less than a predefined threshold, then the possible location is a true instance of a standard cell.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

The invention will be described with reference to the accompanying drawings, wherein.

DETAILED DESCRIPTION OF THE INVENTION

Figure 1:
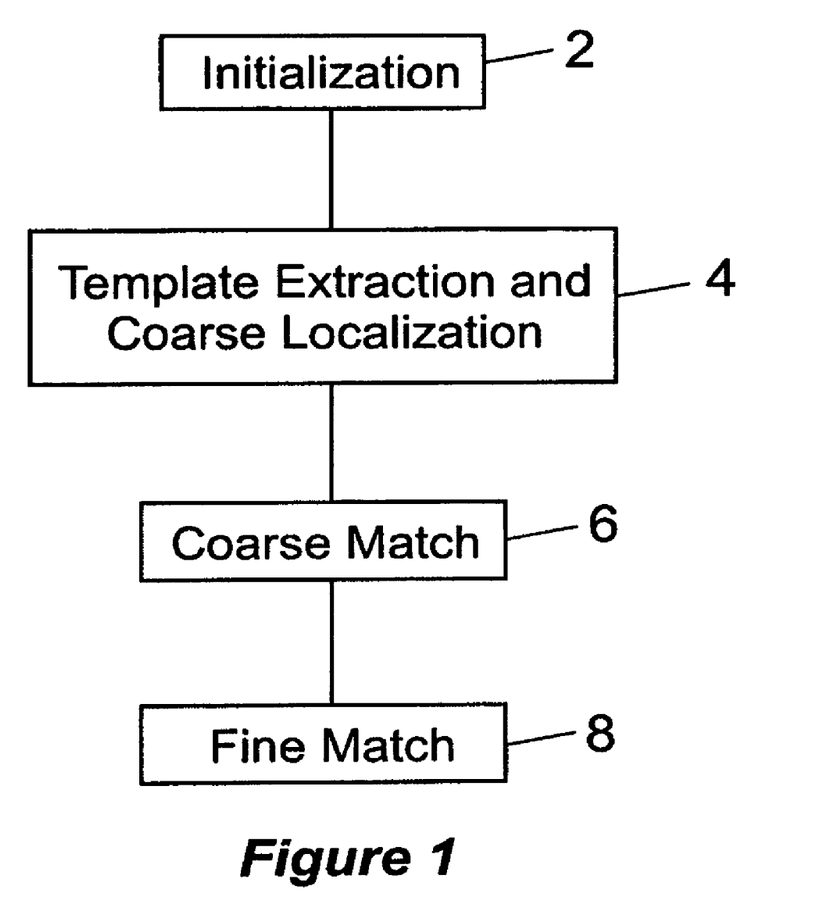
FIG. 1 shows a flowchart showing the process steps of the present invention.

The present invention provides a computationally efficient method for finding the location of standard cells in an IC layout. FIG. 1 shows a flowchart of the four main steps of the present invention. The first step 2 is an initialization process that happens before the operator begins the circuit extraction. It is necessary to extract features of the entire image that will be used as the basis for comparison for the subsequent step. The second step 4 defines the template of the standard cell and provides a coarse localization of possible matches. The third step 6 acts as a coarse filter or coarse match for the possible matches found in the second step 4. The fourth and last step 8 provides a fine filter or match for the resulting possible matches found in step 6. Steps 2 and 4 provide a shortlist of possible locations of the standard cell in question and steps 6 and 8 perform a more rigid comparison on the shortlist. These steps will now be explained in greater detail. The first step of the initialization process 2 of FIG. 1 is to extract the points of interest of the image.

Figure 2:
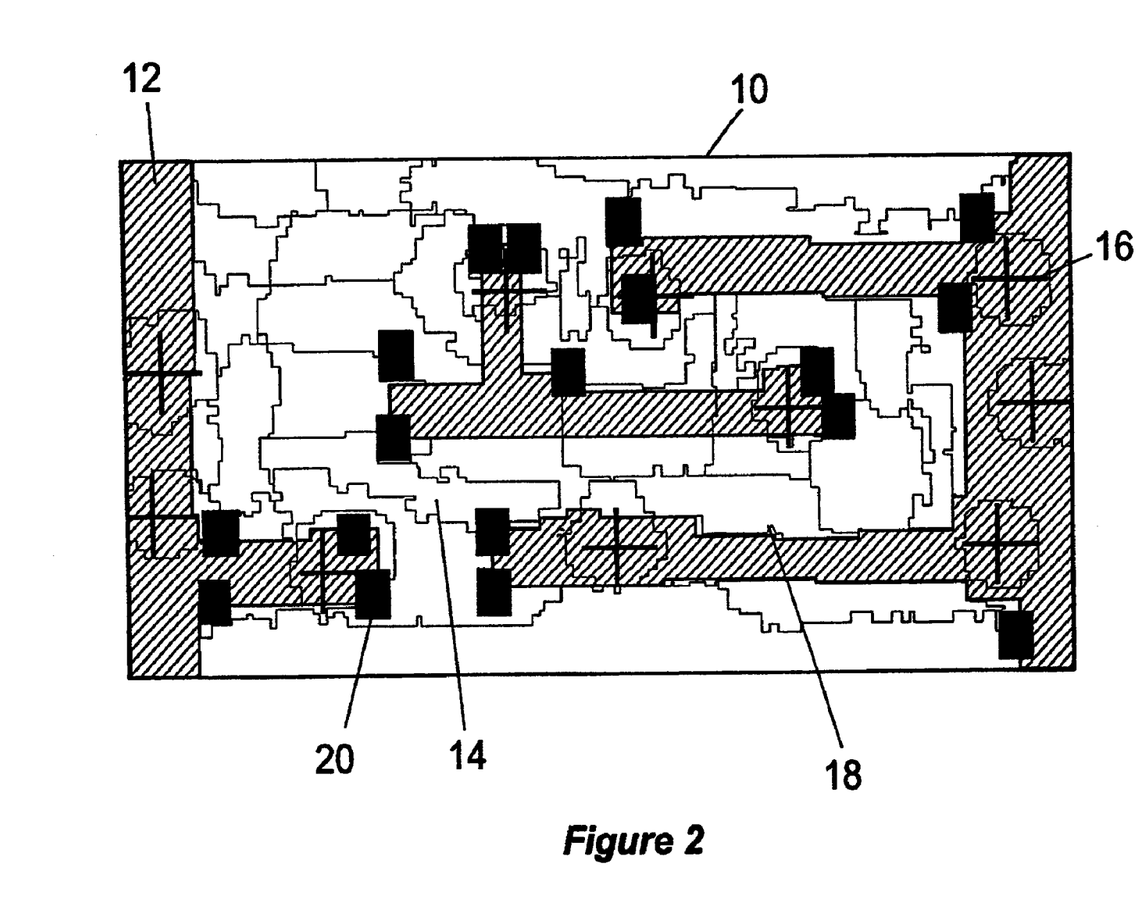
FIG. 2 shows an example of extracted points of interest on a portion of an IC layout.

The first step in standard cell localization is feature extraction or points of interest extraction. In U.S. Pat. No. 6,711,293 issued to Lowe, which is herein incorporated by reference, the points of interest are pixel amplitude extremes, and the descriptors are derived from local histograms. In a layout of an IC, the local histograms are essentially the same, and a descriptor that will reflect wiring geometry in the vicinity is desired. The points of interest that are considered for the present invention include the centers of contacts, which are connections between the first conductive layer and the polysilicon layer, vias connections between conductive layers and corners of the polygons representing the lowest conductive layer. Points of interest can be extracted from higher conductive metal layers, but the number of points of interest generated just from the one conductive metal layer is sufficient. The contacts, which connect the lowest conductive metal layer to the polysilicon layer, do not vary between cell instances, but they may not always be available due to difficulties in conductive metal de-layering or SEM imaging. Vias, which electrically connect adjacent conductive metal layers, can vary between cell instances. The corners of the conductive metal polygons are always available, but may vary between cell instances. FIG. 2 shows an example of extracted points of interest on a portion of an IC layout 10 with a first-level conductive metal layer. The hatched regions indicate the conductive metal layer 12 and the solid images underneath represent the polysilicon 14. The contacts 16 are denoted by crosses, the vias 18 by triangles and the corners 20 of conductive metal layers by squares. The selection of points of interest was limited to those mentioned above because they produced a sufficient number of points and were specific to the application of reverse engineering IC layouts.

Figure 3:
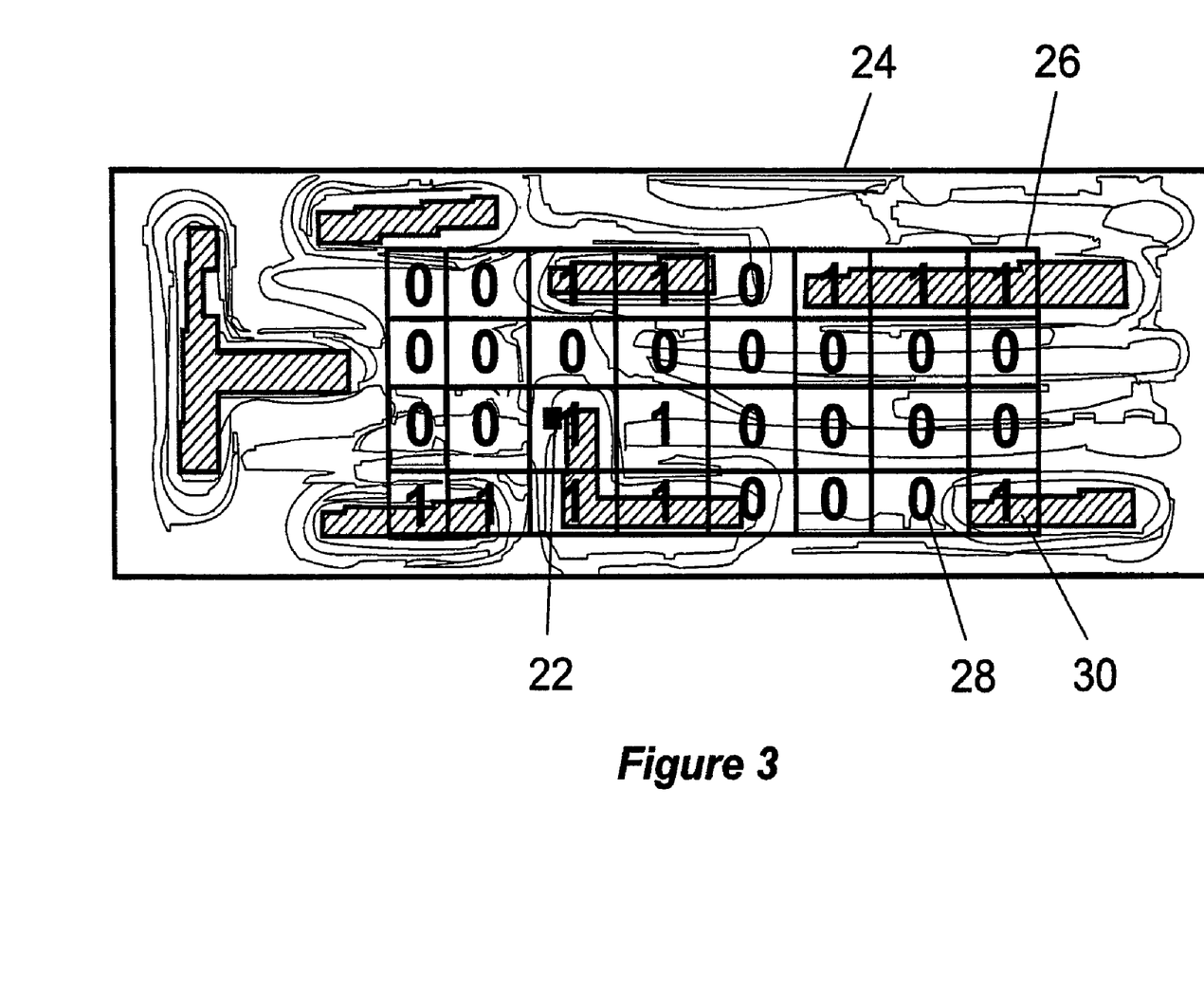
FIG. 3 shows an example of a 32-bit descriptor for a point of interest.

The next step is to characterize each point of interest. For example, a 32-bit descriptor is built around each point. This bitmap descriptor is essentially a grid with 32 non-overlapped rectangles. If a conductive metal polygon occupies a minimum pre-determined percentage of a rectangle, the rectangle is set to 1. If no conductive metal polygon occupies the rectangle or it is less than the minimum pre-defined percentage, the rectangle is set to 0. The 32-bit descriptor, in the vicinity of the point of interest, essentially describes the shape of the lowest conductive metal layer. FIG. 3 shows an example of how a 32-bit descriptor is built. The point of interest 22 of an image 24 is surrounded by a 32-bit descriptor 26. The rectangles 28 having less than the pre-determined percentage of a conductive metal polygon are set to 0 and the rectangles 30 having more than the pre-determined percentage of a conductive metal polygon are set to 1.

The second step 4 of the present invention as indicated by FIG. 1 is to extract the standard cell, which will be used as a comparison template and to perform a coarse localization of possible matches. When the operator extracts an area of the IC layout that represents a standard cell, the operator indicates that the cell is a standard cell and will be used as a template to help locate other standard cells in the layout. The user can highlight or create a box around the selected area. Those skilled in the art will understand that any means of identifying certain portions of the layout as containing standard cells either by automatic or manual means falls within the scope of this invention.

Figure 4:
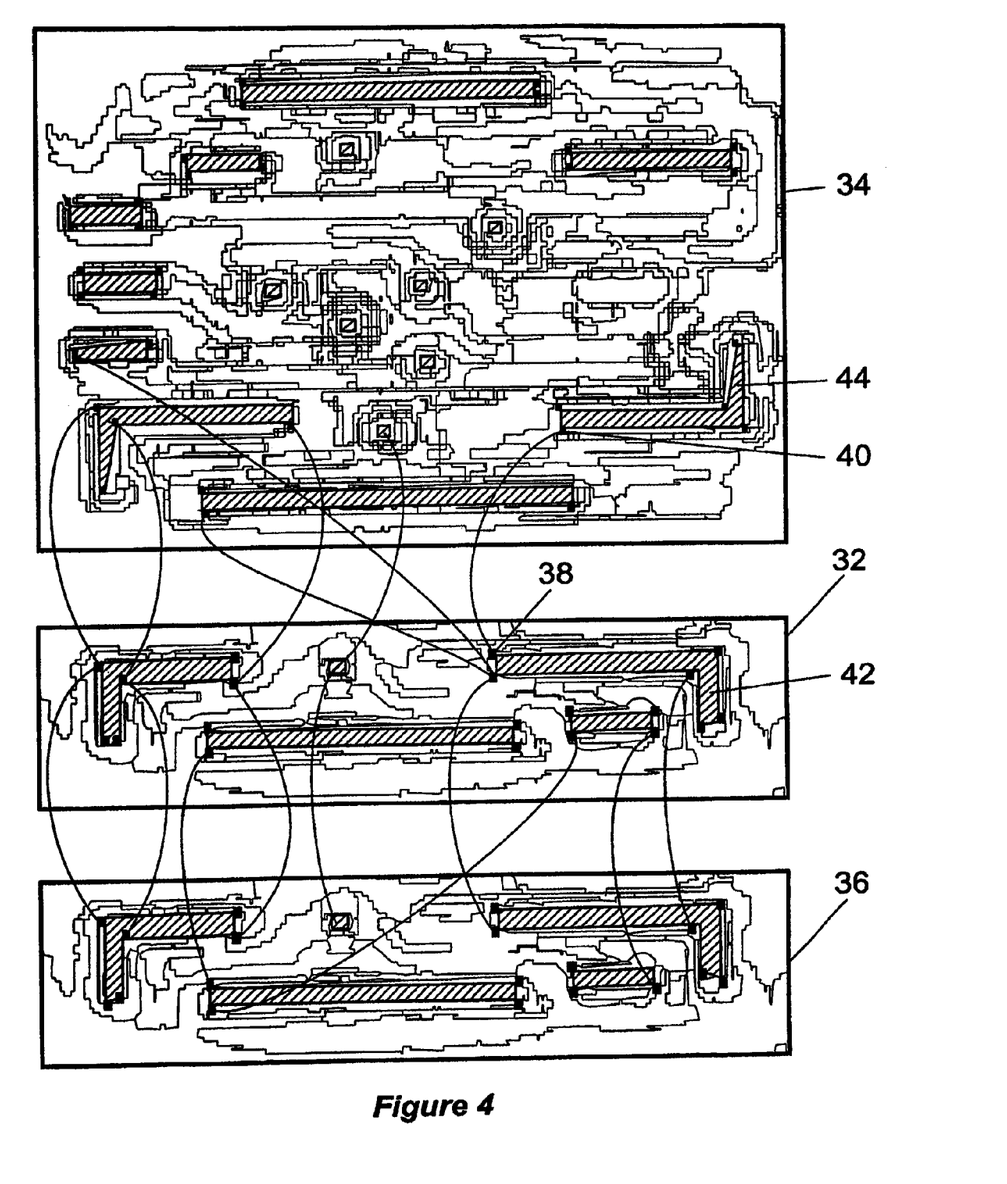
FIG. 4 shows a template being compared with first and second image portions.

After the operator creates a template, the points of interest within the template are compared to all the points of interest within the image. The basis for comparison is the 32-bit descriptor. To account for possible transformations of the template within the image area, eight 32-bit descriptors, representing the eight possible transformations of the template, are created. This includes transformations of 0°, 90°, 180° and 270°, as well as the mirrored versions of each of these rotations. Each bit of the 32-bit descriptor of a template point of interest is compared to the corresponding bit of each 32-bit descriptor for each point of interest within the image. This comparison is an XOR operation. The result is a 32-bit integer where each bit represents a comparison value between a bit of the 32-bit descriptor of a template point of interest and the corresponding bit of each 32-bit descriptor for each point of interest within the image. The number of bits within the 32-bit integer representing positive matches is counted. If this number is greater than a pre-defined threshold, the point of interest of the image is considered similar to the point of interest of the template. If the number is less than the pre-defined threshold for all eight 32-bit descriptors of a point of interest, it is discarded as an unsuccessful match. FIG. 4 shows an example of a template 32, a first image portion 34 and a second image portion 36. The template's 32 points of interest are compared with the points of interest of the first image portion 34 and the points of interest of the second image portion 36. Only a sample of the comparisons is shown here. A first point of interest 38 from the template 32 is compared with a first point of interest 40 from the first image portion 34. This example shows that a comparison based solely on the positions of points of interest does not provide as rugged a match when using the 32-bit descriptors. A first polygon 42 on the template 32 contains the first point of interest 38. A first polygon 44 on the first image portion 34 contains the first point of interest 40. The first polygon 42 is not exactly the same as first polygon 44, but its function is identical. It would be presumptuous to discard the first point of interest 40 as an unsuccessful match. In using the 32-bit descriptor as a basis for comparison, the tolerances are pre-defined and thus the comparison is less rigid.

Figure 5:
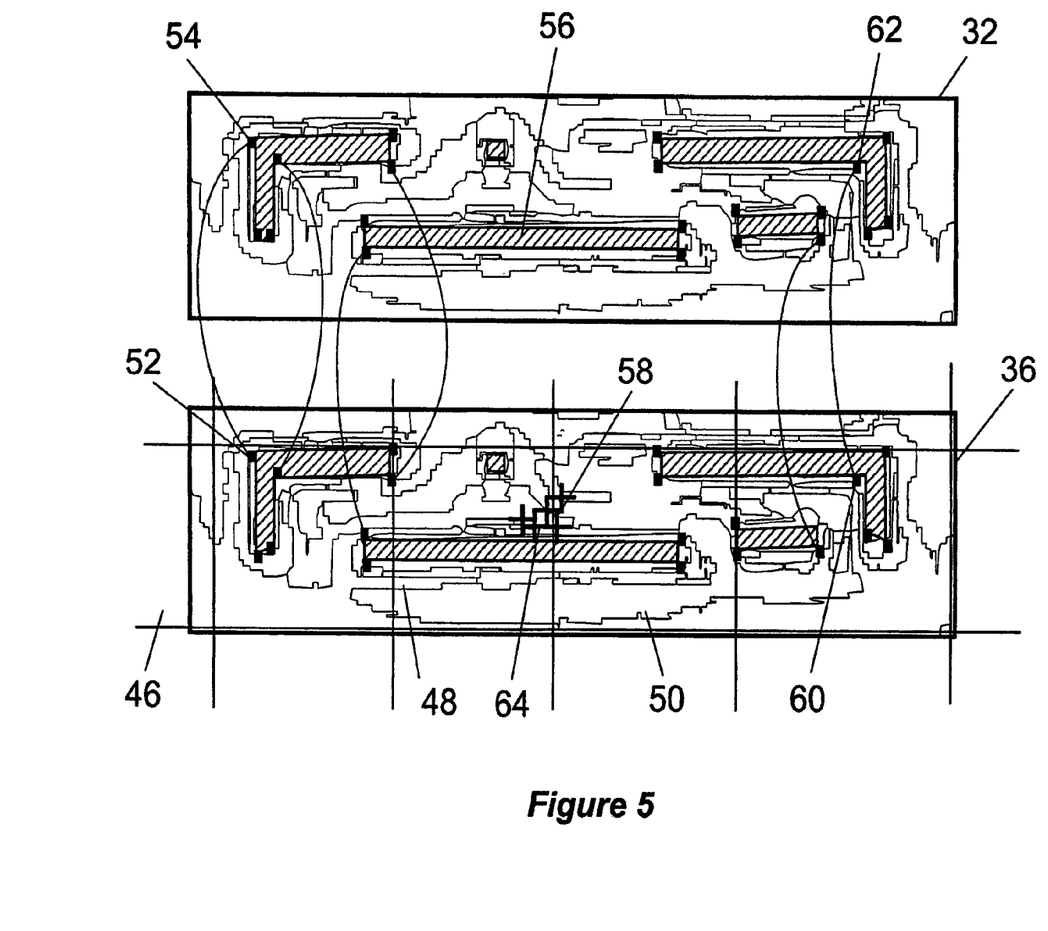
FIG. 5 shows the vote casting resulting from the comparison of a first set of similar points of interest from the template and second image portion of FIG. 4.

Once it has been determined that a point of interest in the image portion is similar to a point of interest on the template, a confidence voting process begins. The image portion is divided into a coarse grid and votes are recorded in each box of the grid. FIG. 5 shows the template 32 and the second image portion 36 of FIG. 4. The second image portion 36 is coarsely divided into a grid including a first box 46, a second box 48 and a third box 50. By comparing the 32-bit descriptor of a first point of interest 52 on the second image portion 36 with a first point of interest 54 of the template 32, it is determined that these two points are similar. The center of the template 32 is given by point 56. When the template 32 is superimposed onto the second image portion 36 such that point 54 is aligned with point 52, the center of the template 56 aligns with a point 58 on the second image portion 36. A vote is cast into the box where point 58 falls into. The result of the vote is represented by a first vote mark 58 that falls into the third box 50. A second point of interest 60 on the second image portion 36 is considered similar with a second point of interest 62 on the template 32. By superimposing the template 32 on the second image portion 36, such that point 62 is aligned with point 60, the vote is given by second vote mark 64 and falls into second box 48. This process continues for the other points of interest and the result is that a majority of the votes fall into the areas surrounding the border between the second 48 and third 50 boxes. These votes represent the confidence value of a possible match. The higher the number of votes in an area, the more confident a possible match is in being a true match.

Figure 6:
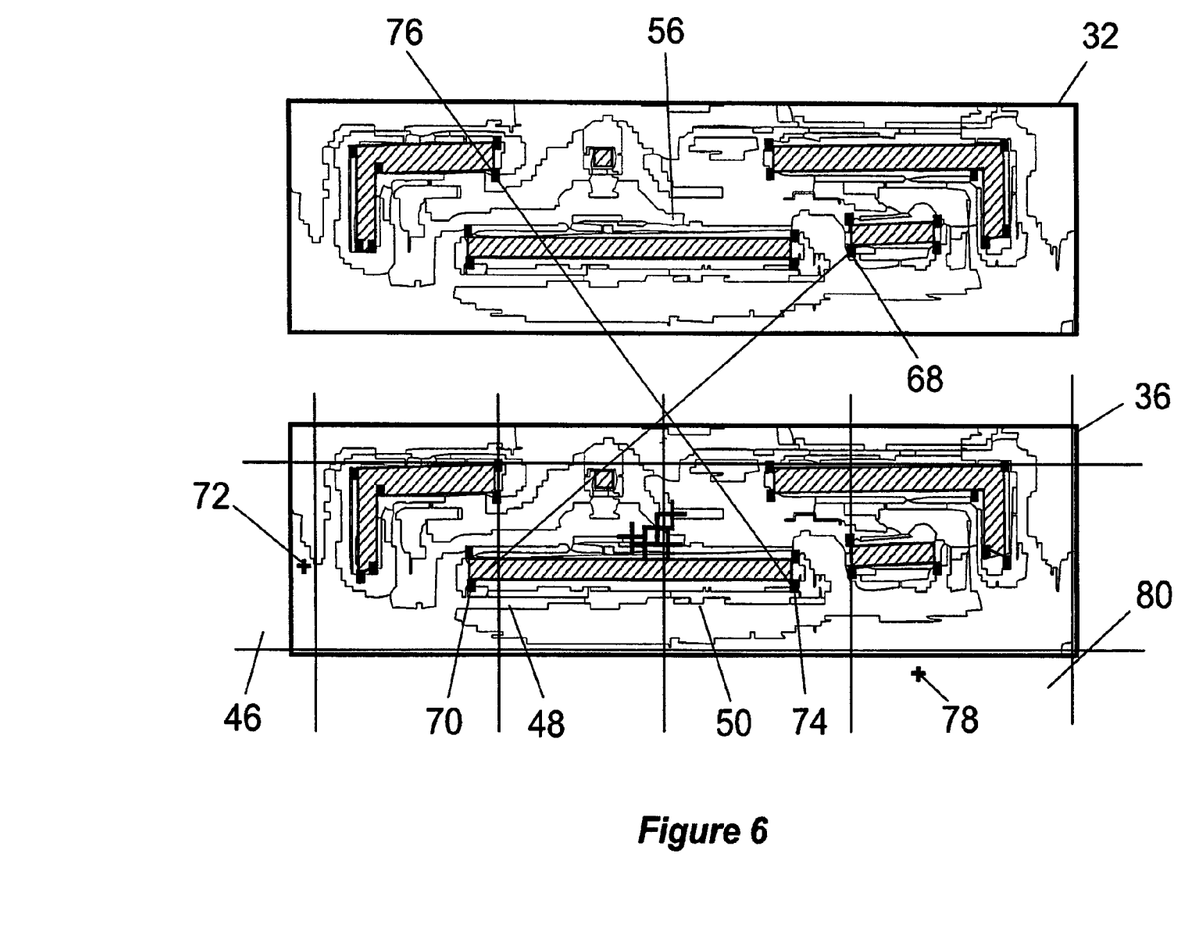
FIG. 6 shows the vote casting resulting from the comparison of a second set of similar points of interest from the template and second image portion of FIG. 4.

FIG. 6 shows the same template 32 and second image portion 36 as FIGS. 4 and 5. In this example, a third point of interest 70 is considered similar to a third point of interest 68 by comparing the 32-bit descriptors of each point. Depending on the tolerance of the comparison between the two 32-bit descriptors, two points may seem dissimilar but are treated as similar as long as there is a minimum number of bit-to-bit matches. When the template 32 is superimposed on top of the second image portion 36 such that point 68 aligns with point 70, the vote, represented by a third vote mark 72 will fall into the first box 46. A fourth point of interest 74 from the second image portion 36 is found to be similar with a fourth point of interest 76 from the template 32 by comparing each of the points' 32-bit descriptors. When the template 32 is superimposed on top of the second image portion 36, the alignment of point 76 with point 74 causes a fourth vote mark 78 to fall into a fourth box 80. The results from FIGS. 5 and 6 show confidence that the voting of points of interest that are true matches will fall within the same area and points of interest that are false positives fall in different areas. After all the votes are cast for all the points of interest of the template and the selected image portion of the IC layout, the average location of the voting marks and the total weight is computed for each cell. For situations such as that shown in FIG. 5 where the majority of the votes are cast on the border of two cells, the two adjacent cells are merged together and the weight is the sum of the two original cells. The cell with the highest weight in the selected image portion is determined to be the center of the template match. This normally gives a precise location of the template match, since one cell will have a considerably larger weight than the other cells.

The last two steps of the process 6, 8 outlined in FIG. 1 perform a more rigid comparison of standard cells to potential matches. The 32-bit descriptor comparison acts as a first filter and the vote casting is a second filter. The subsequent rigid comparison, which is more time consuming than the first two steps, is performed only on the shortlist of possible positive matches found by the vote casting.

The coarse filter or match 6 is done by methods already known in the art such as image pyramids, which are done in a coarse-to-fine manner. This method is disclosed in the following publication: S. L. Tanimoto, "Template matching in pyramids", Computer Graphics Image Processing, 16 (1981) 356-369 which is herein incorporated by reference.

Figure 7:
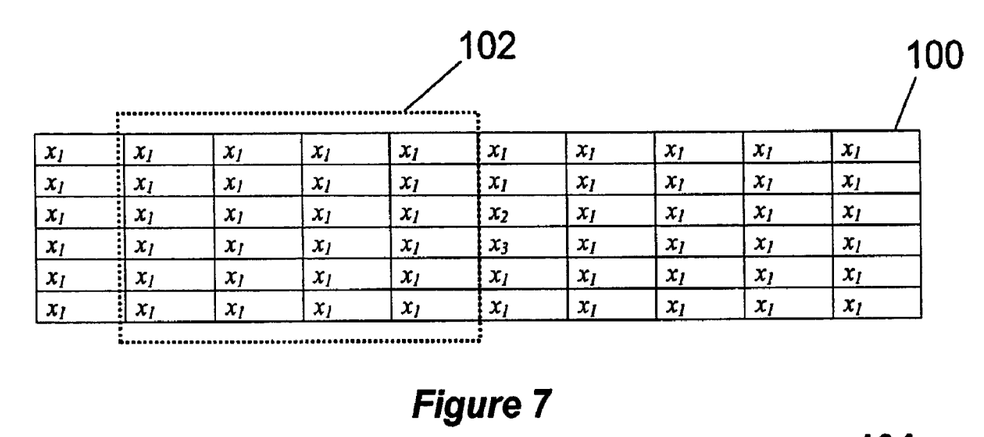
FIG. 7 shows an example array of the dot gradients between the template and a possible match.
Figure 8:
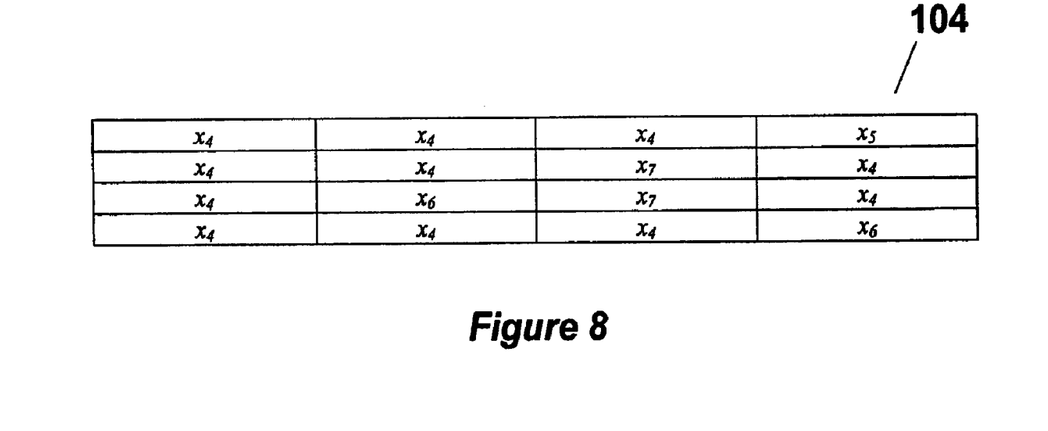
FIG. 8 shows an array of order statistics.

The fine filter or match 8 is a modified pattern recognition algorithm based on the following publication: M. Ulrich, C. Steger, A. Baumgartner "Real-time object recognition using a modified generalized Hough transform", Pattern Recognition 36 (2003) 2557-2570 as well as the following: U.S. Published Patent Application 2002/0057838 by Steger on May 16, 2002 and U.S. Published Patent Application 2004/0042661 by Ulrick et al on Mar. 4, 2004. The aforementioned documents are all incorporated herein by reference. There are five steps to this modified process of the present invention. The first step is to compute gray-scale gradients for the template and the possible matches using kernels of different sizes (i.e. n×n pixels). These gradients are represented in vector format where the length of the vector is proportional, yet less than the minimum feature size (i.e. minimum gate length, minimum wire length) of the image area. The next step is to compute the dot products between the template gradients and the possible match gradients. These dot products represent the difference between the template and the possible match, such that the higher the dot product, the greater the difference between the two image portions. The results of the dot products then undergo morphological dilation, a statistical technique known in the art. FIG. 7 shows an example array 100 of the dot gradients between the template and a possible match. Assume the relationship between the dot products is given by: $x_1 \ll x_2 < x_3$. Under morphological dilation the cells are replaced with the minimum adjacent dot product. In the case of FIG. 7, all cells will contain $x_1$. This morphological dilation accounts for differences caused by noise or brightness/contrast differences between the template and the possible match. If a difference occurred due to existing metal layout differences between the template and the possible match, there will likely be more occurrences of $x_2$ and $x_3$. Following this step of morphological dilation, order statistics are computed. The sum of the dot products within an n×n kernel 102 of the example array 100 is computed and the result is put into another array. FIG. 8 shows an array of order statistics 104 wherein each cell represents the sum of dot products within a kernel 102. Assume the relationship between the results in this example is given by: $x_4 < x_5 < x_6 \ll x_7$. The results from FIG. 8 from lowest sum to highest sum are given by: $x_4, x_4, x_4, x_4, x_4, x_4, x_4, x_4, x_4, x_4, x_4, x_4, x_5, x_6, x_6, x_7, x_7$. In looking at this result, the top twenty percent of the sums are examined. If these sums exceed a predefined threshold, then the possible match is discarded as an unsuccessful match. If these sums are less than the predefined threshold, the possible match is determined to be a high probability match.

In the process outlined above, certain steps rely on threshold values to determine a positive or negative match, such as the threshold value required for the 32-bit descriptor and the threshold required for the order statistics. If an operator had, at his disposal, a plurality of "training cell images" for the standard cell, i.e. a set of true matches of the standard cell, he could use the information from these matches to determine threshold values. By running template matching algorithms on the known template matches, one can work backwards to determine the thresholds required. Finding these "training cell images" however, decreases the operator's performance and in auto-routed layouts, determining the locations of instances of standard cell may not be possible in a reasonable amount of time and thus would make the time and computation savings of the present invention pointless. Instead, a form of self-calibration or bootstrapping is used. This consists of estimating the point-wise noise, texture variations and minimum feature size of the image. There are methods known in the art to estimate noise and texture energy using approximations of functions with bounded mixed derivatives. The difference between the analytically computed approximation characteristics and the actual image is attributed to point-wise noise or the presence of a texture. To estimate the minimum feature size, the typical minimum distance between points of interest can be computed using computational geometry algorithms known in the art. Once the estimation of the noise parameters is done, a plurality of distorted cell images, analogous to the "training cell images", can be produced. Appending random noise and texture with the estimated parameters computed above could create these distorted cell images, which can be used to determine the required thresholds.

Figure 9:
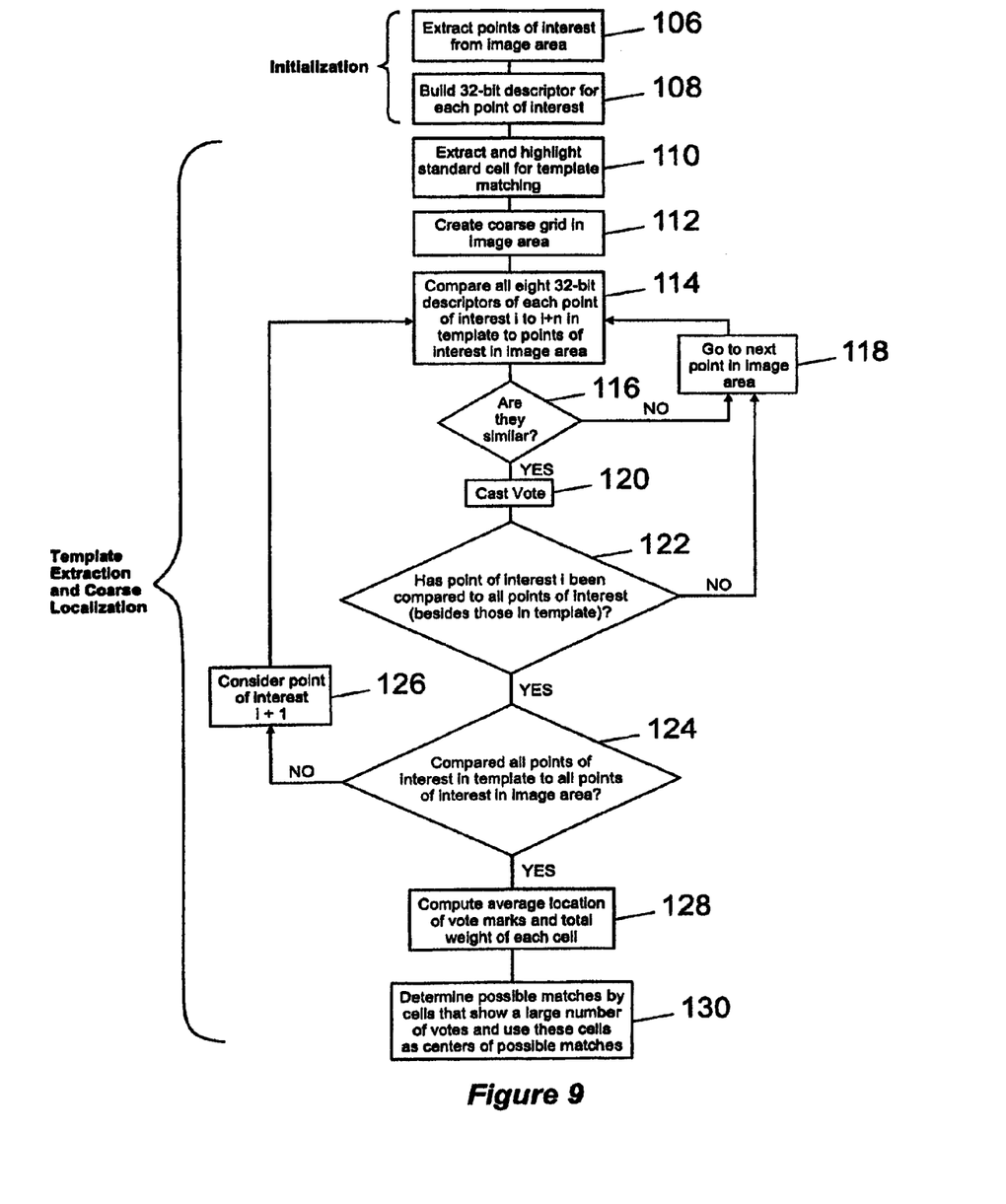
FIG. 9 is a flowchart showing the initialization, template extraction and coarse localization process steps of the present invention.

FIG. 9 represents the first two process steps 2, 4 of FIG. 1. The first two steps 106, 108 of FIG. 9 form the initialization step 2. The first step 106 is to extract all the points of interest from the image. As mentioned earlier, this would include centers of vias and contacts and corners of the polygons representing the lowest conductive metal layer. The next step 108 is to build a 32-bit descriptor for each point of interest. The 32-bit representation is a bitmap representation of the lowest conductive metal layer in the vicinity of the point of interest. Once these steps are completed, the operator can start extracting circuitry.

The remaining steps outline the template extraction and coarse localization process. As soon as the first instance of a standard cell is extracted, the operator highlights the cell for template matching 110. The next step 112 is to create a coarse grid in the image area in which to cast votes. Each point of interest in the standard cell template is then compared with each point of interest in the rest of the image area 114. This is based on the comparison of the eight 32-bit descriptors (representing the eight possible template transformations) for each point. The next step 116 queries the result of the comparisons. If the point of interest on the image area does not have a minimum number of positive bit-to-bit matches with any of the eight 32-bit descriptors of the point of interest on the template, the next point of interest in the image area is considered 118. If the minimum number of matches is reached, a vote is cast 120 in the area that aligns with the center of the template when the template is superimposed on the image area such that the point of interest of the template aligns with the similar point of interest in the image area. Once the vote is cast, another query 122 determines if a point of interest i has been compared to all of the points of interest in the image area. If it has not, it gets compared with the next point of interest in the image area 118. If it has, the next query 124 is whether all points of interest in the template have been compared to all the points of interest in the image area. If not all the points of interest of the template have been considered, the next point of interest of the template, i+1, compares itself against all the points of interest in the image area 126. Once all the points of interest of the template have been compared against all the points of interest in the image area, the average location of the vote marks and their total weight in each cell of the coarse grid is computed 128. The final step of the first half of the process of the present invention is to determine which image portions are suitable matches for the template 130. In general, image portions that match the template will have a cell having a great majority of the votes. This cell, in most cases, represents the center of a matched template.

Figure 10:
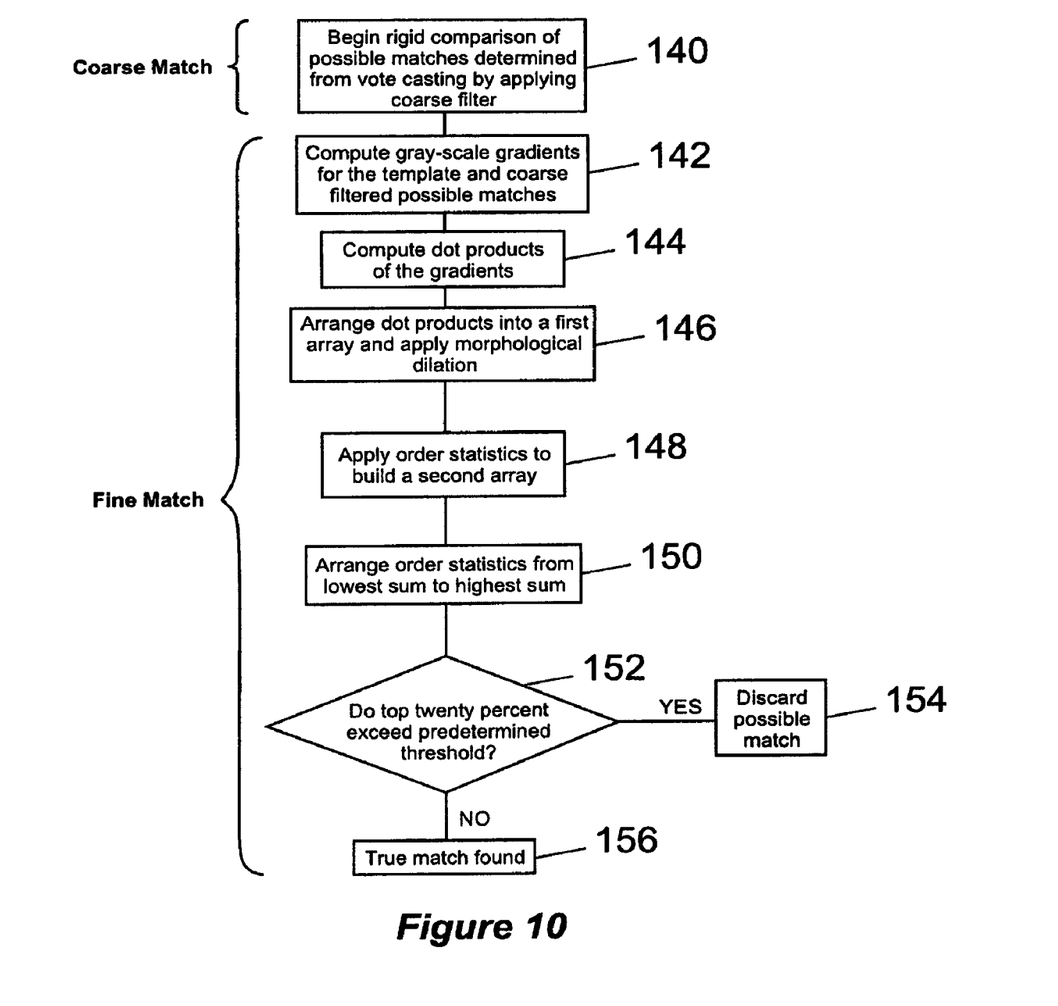
FIG. 10 is a flowchart showing the coarse match and fine match process steps of the present invention.

FIG. 10 represents the third and fourth process steps 6, 8 of FIG. 1. The first step of the rigid comparison is to apply 140 the coarse filter to the possible matches determined from the vote casting. The remaining steps deal with the fine match or filter. The first step of this process is to compute 142 the gray-scale gradients for the template and the possible matches from the coarse filtering. Once the gradients are determined, the next step is to compute 144 the dot products of the gradients from the template and the gradients of the possible matches from the coarse filtering. The dot products are then arranged 146 into an array and then replaced with the minimum adjacent dot product under morphological dilation. This array is then arranged as order statistics. The first array is divided into n×n kernels and the sum of the dot products for each kernel is arranged 148 into a second array. The results are then arranged 150 from lowest sum to highest sum. The next step queries the results and determines 152 if the top twenty percent of the sums exceeds a predetermined threshold. If it does, the possible match in question is discarded 154. If not, the possible match is determined 156 to be a high probability match.

The present method is particularly advantageous since comparing points of interest of a standard cell is more computationally efficient than doing a more rigorous pixel-by-pixel comparison.

The description up to now, including FIGS. 1 to 10, has outlined the process of determining possible standard cell locations. Once a list of the aforementioned high probability matches has been derived, it is necessary to identify the input and output pins. This aids in placing these high probability match standard cells with the rest of the circuitry and to obtain a netlist representation of the circuit. To place the input/output (I/O) pins on the high probability matches, the original standard cell that was boxed by the operator is used as a template so that the (x,y) coordinates of each I/O pin of the original standard cell is mapped to the high probability matches. This coordinate mapping would also take into account rotated and mirrored versions of high probability matches. A certain tolerance is allowed for misalignment since the coordinates of the I/O pins of the original standard cell may not map exactly to conductive pixels on the high probability matches. The details on how a netlist is created from the I/O pins of standard cells, logic gates and other electrical components is described in U.S. Published Patent Application 2003/0084409 by Abt et al. on May 1, 2003. This application is herein incorporated in its entirety by reference.

In some cases, two or more I/O pins on a high probability match may be shorted together. This could be an indication of either an incorrect match or an incorrectly shorted polygon. These cases are flagged for further examination by the operator to determine the type of error. The high probability matches with shorts form a small percentage of the total so it is not very time-consuming for an operator to analyze them individually.

Figure 11:
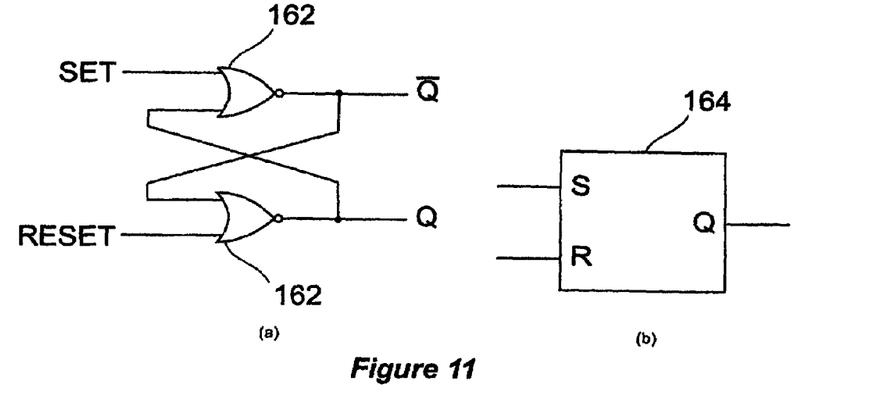
FIG. 11a is a gate representation of an SR latch.
FIG. 11b is a symbolic representation of an SR latch.
Figure 12:
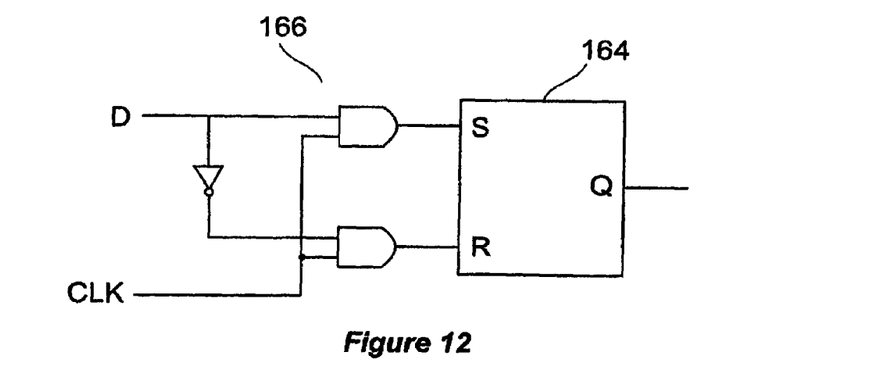
FIG. 12 is a gate representation of a D latch including the symbolic representation of the SR latch.

Most ICs will have a plurality of standard cells. As the circuit extraction progresses, the situation will arise where standard cell A is also a subset of standard cell B. FIG. 11(a) shows a gate representation of an SR latch 160 using NOR gates 162. FIG. 11(b) shows the symbol of an SR latch 164. FIG. 12 shows a gate representation of a D latch 166. The D latch includes the SR latch 164. The SR latch 164 is seen as a subset of D latch 166. When the SR latch 164 is first identified as a standard cell, all the locations of the high probability matches will be stored in memory. Each match has its own signature to identify it from the plurality of other matches. When the operator identifies the D latch 166 as a standard cell, the process for locating other instances of the D latch 166 begins. As high probability matches are found, the system queries the match to investigate whether other standard cells exist within the match. The methods of performing queries are known to those skilled in the art. Some examples are included in the following publications: V. Gaede, O. Gunther, "Multidimensional Access Methods", ACM Computing Surveys, vol. 30, no. 2 (1998) 170-231 and A. P. Popescu, "A Study of R-Tree Based Spatial Access Methods", Master's Thesis, Dept. of Computer Science, University of Helsinki 2003. The aforementioned documents are all incorporated herein by reference. When the system discovers instances of the SR latch 164 within the high probability matches of D latch 166, the instances of the SR latch 164 are removed from these matches of D latch 166 to avoid duplication. Performing these queries on each high probability match of a standard avoids the creation of duplicate or erroneous circuitry in the netlist and schematics.

Figure 13:
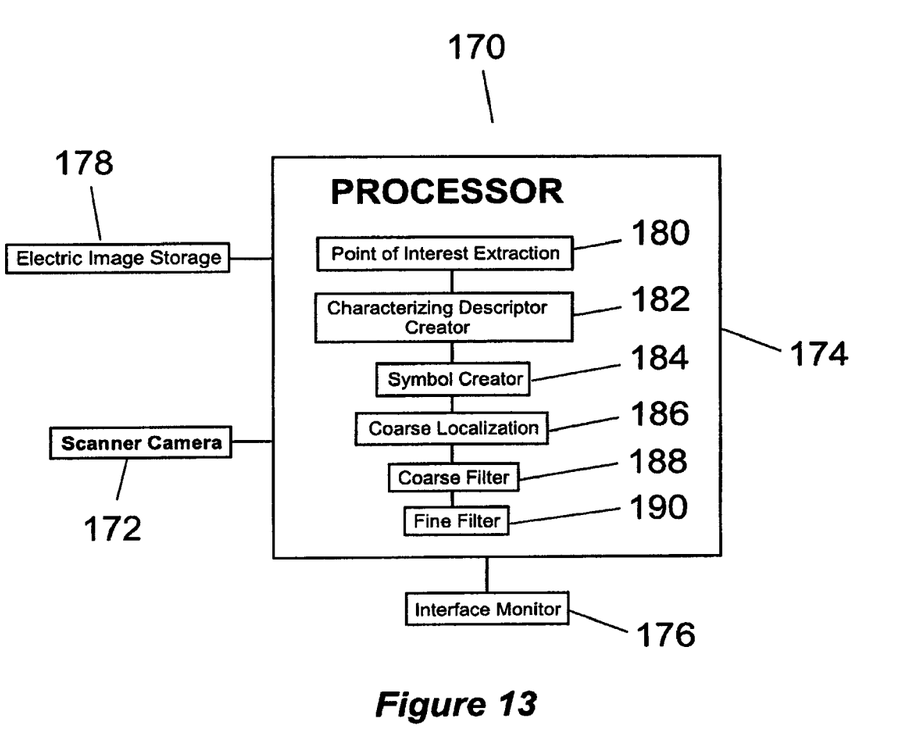
FIG. 13 is an apparatus of the preferred embodiment of the present invention.

The method of locating high probability matches of standard cells in an integrated circuit in accordance with the present invention can also be described in conjunction with the apparatus 170 schematically illustrated in FIG. 13. Apparatus 170 comprises scanner camera 172, processor 174, interface monitor 176 and electronic image storage or memory 178. The integrated circuit must be de-capped to expose the top layer of the circuit in question, which is normally a metal layer. The exposed layer is scanned under high magnification using a scanner 172 based on film, a digital camera, a scanning electron microscope (SEM) or an X-ray camera under the control of an operator using a processor 174 through an interface/monitor 176. It is preferred to use a SEM or some such device in order to attain the high magnification required, as well as to produce an electronic image. Normally, the entire surface of the integrated circuit would have to be scanned. This is usually accomplished by producing a series of overlapping images that are stitched together electronically to form a single electronic mosaic image of the entire layer. Next, the electronic image of the stored image representing the layer of the IC layout is transformed into a vector representation and stored in memory 178. Once the entire layer or the desired portion of layer has been scanned, it is determined whether there is a further layer to be scanned. If that is the case, the previously scanned layer is removed to expose the next layer of the integrated circuit to be scanned. This process continues for all of the layers required to analyze the IC. Once all of the layers have been scanned and stored electronically in vector format in memory 178, the layers are aligned vertically and horizontally using the vector data of the layers. The layers are then overlaid in their proper sequence to form a three dimensional vector image of the IC, which may be viewed on interface/monitor 186. Each layer may be represented by a different color or cross-hatching to facilitate the viewing of the different layers by an operator, which in turn will allow the operator to readily recognize circuit elements such as transistors, gates and even more complex circuits.

The processor 174 comprises the following algorithms within its memory: point of interest extraction 180, characterizing descriptor creator 182, symbol creator 184 to create a first instance of a standard cell, coarse localization 186, coarse filter 188 and fine filter 190. The point of interest extraction algorithm 180 extracts all the points of interest particular to the application of circuit extraction from an IC layout including the centers of contacts and vias as well as corners of polygons representing the lowest conductive layer. These points are extracted from the entire IC layout. The characterizing descriptor creator algorithm 182 creates a descriptor to characterize each point of interest. The preferred embodiment of the present invention uses a 32-bit bitmap descriptor in the vicinity of each of interest, but other descriptors known to those skilled in the art fall within the scope of this invention. The symbol creator algorithm 184 creates a symbol of a group of transistors that an operator defines as a standard cell. The symbolic representation of the group of transistors includes I/O pins and attributes of the group such as widths and lengths of the transistors. This symbolic representation of the standard cell is used as a template for locating other possible standard cells. The coarse localization algorithm 186 determines a coarse list of possible locations of standard cells. The coarse localization algorithm can be further divided into sub-algorithms: a descriptor comparison algorithm and a vote-casting algorithm. Once a first instance of a standard cell or template has been extracted through the symbol creator algorithm 184, a descriptor comparison algorithm compares the descriptors from the template to all the other descriptors in the IC layout. The comparison is done through an XOR operation and the result is a 32-bit integer where each bit is a comparison value between a bit of the 32-bit descriptor of the template and the corresponding bit of each 32-bit descriptor for each point of interest within the image. If the number of positive matches is greater than a pre-defined threshold, the point of interest of the image is considered similar to the point of interest of the template. Those skilled in the art will realize that other comparison methods exist and fall within the scope of the invention. Following the comparison, a vote casting algorithm casts votes on the similar points of interest. This algorithm casts votes on the similar points of interest to determine a confidence level on the similarity between a point of interest on the template and a corresponding "similar" point of interest determined from the descriptor comparison algorithm. The votes are weighted and the image area surrounding a "similar" point of interest having a high weight count is considered as a possible location of a standard cell. Coarse filter 188 further filters the possible locations of standard cells to obtain a set of coarse filtered possible locations. Such methods are known in the art such as image pyramids. Fine filter algorithm 190 filters the coarse filtered possible locations to narrow the set down further to a list of high probability matches. The fine filter algorithm can be further divided into sub-algorithms: gradient computation, dot product calculation, morphological dilation and order statistics. The gradient computation calculates the gray-scale gradients between the template and the coarse-filtered possible locations based on kernels of various sizes. The dot product calculation determines the dot products between the template and one of the coarse-filtered possible locations. These dot products represent the difference between the template and the possible match, such that the higher the dot product, the greater the difference between the two image portions. The morphological dilation algorithm constitutes a statistical algorithm that smoothes out the dot products to account for difference caused by noise or brightness/contrast differences between the template and the possible match. The order statistics algorithm sums the dot products resulting from the morphological dilation within and n×n kernel and the results are put into an array. These sums are then arranged from lowest to highest and the top twenty percent of sums are examined. If these sums exceed a predefined threshold, then the possible match is discarded as an unsuccessful match. If these sums are less than the predefined threshold, the possible match is determined to be a high probability match of the standard cell.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. A rigid comparison method of determining whether a possible location of a standard cell in an image of an IC layout is a true high probability match of the standard cell represented by a template comprising:

computing gradients for the template and a possible location from a set of possible locations;

computing a first set of dot products of the gradients;

applying morphological dilation of the first set of dot products to obtain a second set of dot products;

determining order statistics on the second set of dot products; and determining if the order statistics are below a predefined threshold, wherein if the order statistics are less than said predefined threshold, the possible location is a true instance of the standard cell.

2. Apparatus for determining whether a possible location of a standard cell in an image of an IC layout is a high probability match of the standard cell represented by a template using a rigid comparison method comprising:

means for computing gradients for the template and a possible location from a set of possible locations;

means for computing a first set of dot products of the gradients;

means for applying morphological dilation of the first set of dot products to obtain a second set of dot products;

means for determining order statistics on the second set of dot products; and means for determining if the order statistics are below a predefined threshold, wherein if the order statistics are less than said predefined threshold, the possible location is a high probability match of the standard cell.

* * * * *